United States Patent [19]

Park et al.

[11] Patent Number: 5,761,136

[45] Date of Patent: Jun. 2, 1998

[54] CIRCUIT FOR GENERATING A COLUMN SWITCH ENABLE SIGNAL OF A MEMORY

[75] Inventors: Chunseong Park; Dong Jun Yang, both of Choongcheongbuk-Do; Byoung Ju Lee, Seoul, all of Rep. of Korea

[73] Assignee: LG Semicon Co., Ltd., Choongcheongbuk-Do, Rep. of Korea

[21] Appl. No.: 769,990

[22] Filed: Dec. 19, 1996

[30] Foreign Application Priority Data

Dec. 21, 1995 [KR] Rep. of Korea ............... 53432/1995

[51] Int. Cl.$^6$ ............................................. G11C 7/00
[52] U.S. Cl. ............................... 365/191; 365/222
[58] Field of Search ............................ 365/191, 194, 365/222, 233, 233.5

[56] References Cited

U.S. PATENT DOCUMENTS

| | | | |
|---|---|---|---|
| 4,646,272 | 2/1987 | Takasugi | 365/233 |
| 4,858,197 | 8/1989 | Aono et al. | 365/233.5 |
| 5,349,566 | 9/1994 | Merritt | 365/233.5 |
| 5,414,672 | 5/1995 | Ozeki | 365/233.5 |
| 5,457,659 | 10/1995 | Schaefer | 365/222 |
| 5,559,752 | 9/1996 | Stephens, Jr. | 365/233 |

*Primary Examiner*—David C. Nelms
*Assistant Examiner*—Son Mai

[57] ABSTRACT

A circuit generates a column switch enable signal of a memory in response to an external column start signal in a normal memory access mode in order to prevent erroneous data from being output from the memory when an abnormal address signal is received. The circuit also generates, in a memory refresh mode, a column switch enable signal having a pulse width corresponding to the width of a sum signal which sums the number of memory accesses. This decreases the amount of current dissipated during the input and output of data. The circuit has a first unit for supplying a first control signal to control the shape of the column switch enable signal based upon an externally-provided column start signal in the normal mode, a second unit for supplying a second control signal to control the shape of the column switch enable signal based upon the externally-provided sum signal in a refresh mode, and a signal generating unit for generating the column switch enable signal based upon the first control signal or the second control signal respectively supplied from the first or second units.

14 Claims, 8 Drawing Sheets

CIRCUIT FOR GENERATING A COLUMN SWITCH ENABLE SIGNAL OF A MEMORY

BACKGROUND OF THE INVENTION

The present invention relates to a circuit for generating a column switch enable signal of a memory, and more particularly to a circuit for generating a column switch enable signal of a memory in response to an external column start signal. By using the column start signal as an external control signal, in a normal memory access mode, the present invention prevents erroneous data from being output from the memory when an abnormal address signal is received. The column switch enable signal may also have a pulse width corresponding to a sum signal which sums address transition detecting signals in a mode other than the normal mode, thereby decreasing current consumed during the input and output of data.

Figure 1:
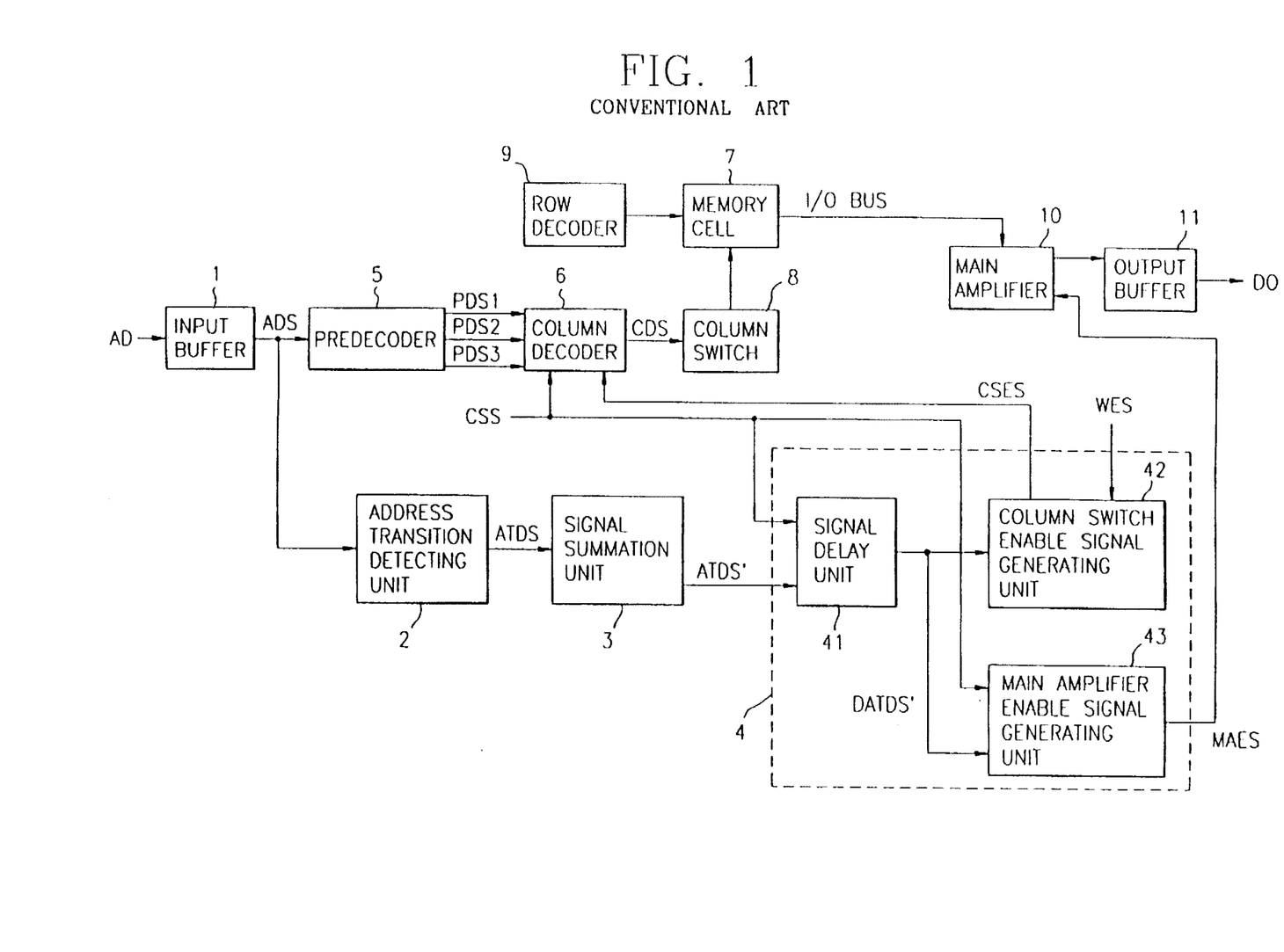
FIG. 1 is a block construction view showing a conventional memory circuit.

As shown in FIG. 1, a conventional memory circuit is connected to a respective column in memory, where one or more memory cells 7 are located. The memory cell will place its contents onto an I/O bus when a row decoder 9 and a column switch 8 produce appropriate access signals.

The conventional memory circuit includes an input buffer 1 for buffering an input address signal AD. An address transition detecting unit 2 detects the transition of the address signal ADS and provides an address transition detecting signal ATDS in accordance with the detection. A signal summing unit 3 sums the address transition detecting signals ATDS from the address transition detecting unit 2 to provide a sum signal (hereinafter referred to as an "ATD summation signal") ATDS' after detecting a predetermined number of the address transition detecting signals ATDS. A signal generating unit 4 generates a column switch enable signal CSES and a main-amplifier enable signal MAES in accordance with the sum signal ATDS' from signal summing unit 3, an externally-supplied column start signal CSS, and a write enable signal WES. The column start signal CSS and the write enable signal WES are well known to those skilled in memory accessing, and are typically produced by a memory controller and/or a microprocessor which desires access to the memory.

Address signals ADS from input buffer 1 are pre-decoded by a pre-decoding unit 5 which then supplies pre-decoding signals PDS1~PDS3. A column decoder 6 decodes signals PDS1~PDS3 from the pre-decoder unit 5 in response to the column start signal CSS and the column switch enable signal CSES, and provides a decoded column decoding signal CDS.

A column switch 8 is switched by the column decoding signal CDS from the column decoder 6 in order to connect a bit line and a data I/O BUS in the memory cell 7 whose word line is enabled by a decoded signal from a row decoder 9. As a result, data is output from the memory cell 7 via the data I/O bus connected by the column switch 8. The data from memory 7 is amplified by a main amplifier 10, and an output buffer 11 buffers the amplified data to provide buffered data DO.

The signal generating unit 4 includes a signal delay unit 41 for delaying the ATD sum signal ATDS' from the signal summing unit 3 for a predetermined time, to produce a delayed signal DATDS' and a column switch enable signal generator 42 for generating the column switch enable signal CSES in accordance with the delayed signal DATDS' and a write enable signal WES. A main-amplifier enable signal generator 43 is provided for generating main-amplifier enable signal MAES in accordance with the column start signal CSS supplied to the signal delay unit 41 and the delayed signal DATDS'.

Figure 2:
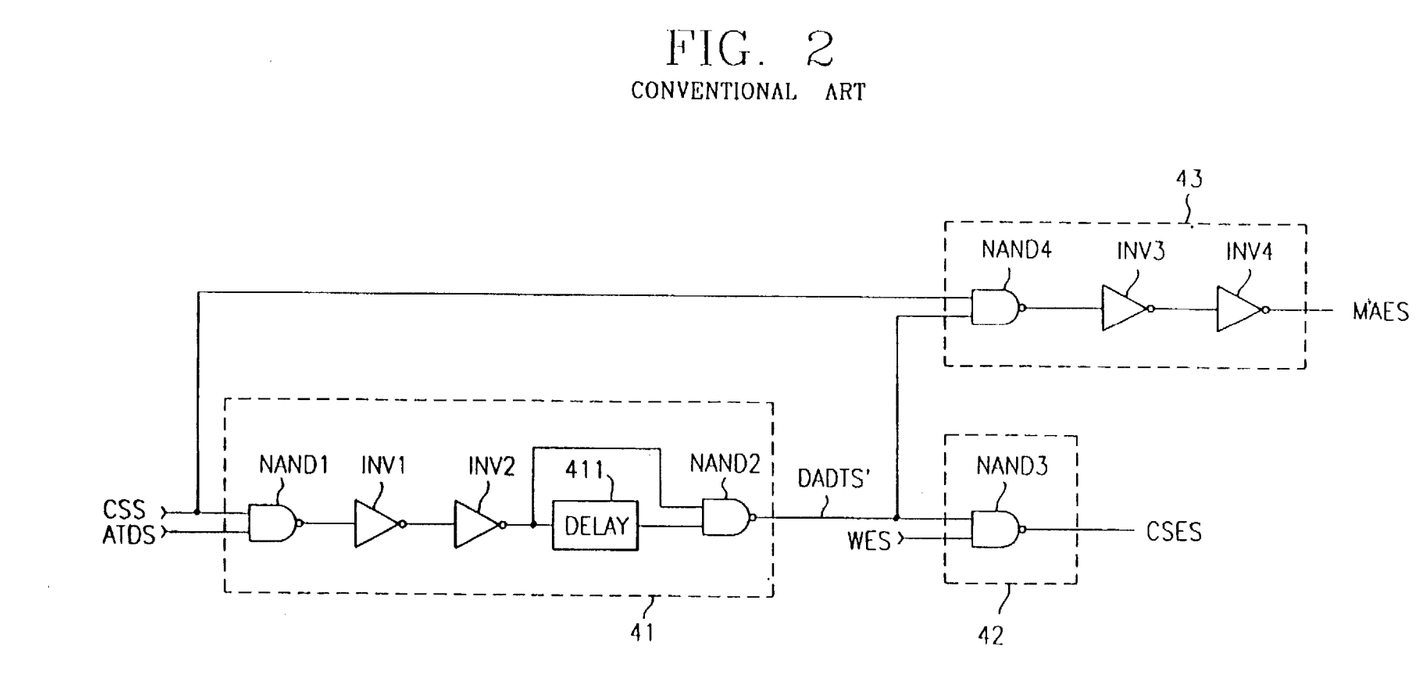
FIG. 2 is a detailed circuit diagram of the signal generating unit shown in FIG. 1.

As shown in FIG. 2, the delayed signal DATDS' is formed by a NAND gate NAND1 for NANDing the externally-input column start signal CSS and the ATD summing signal ATDS' from the signal summing unit 3, and inverter INV1 and INV2 for sequentially inverting the signal from the NAND gate NAND1. A delay device 411 delays the signal from inverter INV2 for a predetermined time, and a NAND gate NAND2 executes the NAND operation on the signals from the inverter INV2 and the delay device 411, respectively.

The column switch enable signal generator 42 is formed by a NAND gate NAND3 which performs a NAND operation on the signal from the NAND gate NAND2 (in the signal delay unit 41) and the externally-input write enable signal WES in order to supply the column switch enable signal CSES.

The main-amplifier enable signal generator 43 has a NAND gate NAND4 for NANDing the externally-input column start signal CSS and the signal from the NAND gate NAND2 (in the signal delay unit 41), and inverter INV3 and INV4 for sequentially inverting the signal from the NAND gate NAND4 to produce the main-amplifier enable signal MAES.

Figure 3:
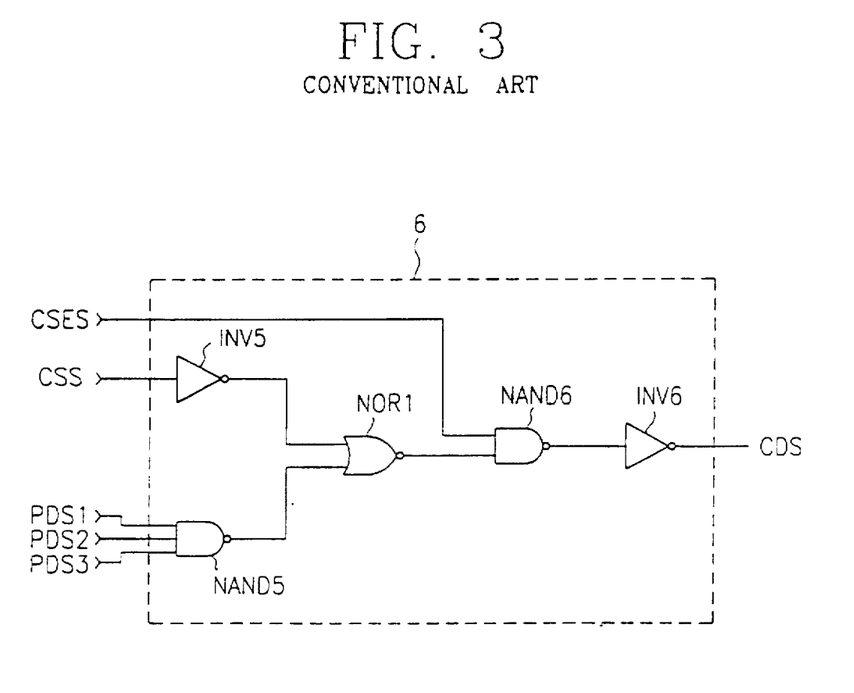
FIG. 3 is a detailed circuit diagram of the column decoding unit shown in FIG. 1.

Referring to FIG. 3, the column decoder 6 includes a NAND gate NAND5 for NANDing the pre-decoding signals PDS1~PDS3 respectively supplied from the pre-decoder 5, and an inverter INV5 for inverting the externally-input column start signal CSS. A NOR gate NOR1 performs the NOR operation on the signals respectively received from the NAND gate NAND5 and the inverter INV5, and a NAND gate NAND6 performs the NAND operation on the signal from NOR gate NOR1 and the column switch enable signal CSES from the column switch enable signal generator 42. An inverter INV6 is also provided for inverting the signal from NAND gate NAND6 to the provide column decoding signal CDS.

A pulse generating operation of the conventional memory circuit constructed as above will be described below.

To begin with, a user executes a predetermined operation for drawing out data previously stored in the memory cell 7. In accordance with the user's operation, an address signal AD that transitions from high to low (as designated by a solid line in FIG. 4A) is supplied to the input buffer 1.

Then, input buffer 1 buffers the input address signal AD to produce the address signal ADS (shown as a solid line in FIG. 4B), and the address transition detecting unit 2 receives the address signal ADS from the input buffer 1 and detects the transition as address signal ADS goes from a high logic state to a low logic state. The address transition detecting signal ATDS is output in the low state in accordance with the detected transition, as designated by the solid line in FIG. 4C.

Successively, the signal summing unit 3 sums the low-logic-level address transition detecting signals ATDS from the address transition detecting unit 2 and produces the ATD sum signal ATDS' in the low logic state.

After this, the NAND gate NAND1 in the signal delay unit 41 receives the externally-provided column start signal CSS on one input terminal, and receives the low-logic-level sum signal ATDS' from signal summing unit 3 on the other input terminal, thereby supplying a high signal whenever the signal ATDS' is in the low logic state, regardless of the logic level of the received column start signal CSS.

The high signal from the NAND gate NAND1 sequentially passes through the inverter INV1 and INV2 to be supplied as a high level signal which is then delayed for a predetermined time via the delay device 411.

Then, the NAND gate NAND2 receives the high logic signal from inverter INV2 on one input terminal and the high signal from the delay device 411 on the other input terminal, and performs the NAND operation, thereby supplying a low logic level signal.

By doing so, the NAND gate NAND3 in the column switch enable signal generator 42 receives the low signal from the NAND gate NAND2 and the externally-provided write enable signal WES, and generates the column switch enable signal CSES at a high logic state whenever the signal from the NAND gate NAND2 is at a low logic level, regardless of the logic level of the input write enable signal WES.

The NAND gate NAND4 in the main-amplifier enable signal generator 43 receives the externally-supplied column start signal CSS on one input terminal and the low signal from the NAND gate NAND2 (in the signal delay unit 41) on the other input terminal. The NAND gate NAND4 produces a high logic signal whenever the signal from the NAND gate NAND2 is at a low logic level, regardless of the logic status of the column start signal CSS. The high level output signal passes sequentially through the inverter INV3 and INV4 to be provided as a high level main-amplifier enable signal MAES, as designated by a solid line in FIG. 4F.

In the meantime, the pre-decoder 5 pre-decodes the address signal ADS from input buffer 1 to supply pre-decoding signals PDS1~PDS3 in high logic states. The NAND gate NAND5 in the column decoder 6 receives the high-level pre-decoding signals PDS1~PDS3 from the pre-decoding unit 5 on first, second and third input terminals thereof, thereby NANDing the inputs to supply a low level signal.

The externally-provided column start signal CSS is inverted via the inverter INV5 from a high logic level to a low logic level.

The NOR gate NOR1 then receives the low level signal from inverter INV5 on one input terminal and the low level signal from NAND gate NAND5 on the other input terminal, and NORs them to provide a high level output signal.

The NAND gate NAND6 receives the high-level column switch enable signal CSES from the NAND gate NAND3 in the column switch enable signal generator 42, and the high level output signal from the NOR gate NOR1 in order to provide a low level signal. This low level signal passes through the inverter INV6 to be produced as a high-level column decoding signal CDS, as designated by the solid line of FIG. 4E.

By doing so, the column switch 8 is turned on when the column decoding signal CDS from the column decoder 6 is switched to the high level, and bit line of the memory cell 7 to be connected to the data I/O bus.

Accordingly, the word line is enabled by the row decoding signal from the row decoder 9 so that the data previously stored in the memory cell 7 is supplied via the data I/O bus.

After this, the main amplifier 10 is enabled by the high level signal from the inverter INV4 in the main-amplifier enable signal generator 43 in order to amplify the data on the I/O bus data.

Also, the output buffer 11 buffers the data from the main amplifier 10 and provides the buffered data DO outside of the memory.

Figure 4A:
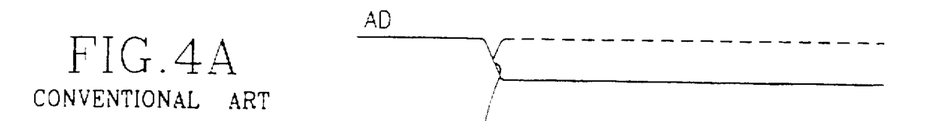
FIGS. 4A through 4I show I/O waveforms of respective units shown in FIG. 1.
Figure 4B:
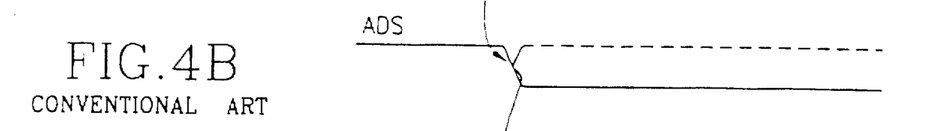
Figure 4C:
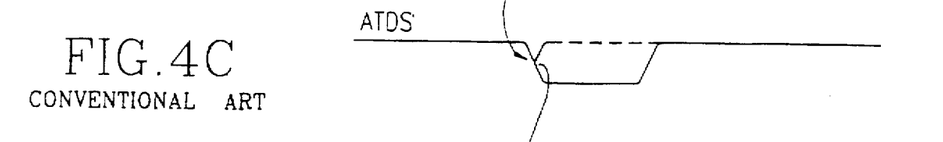
Figure 4D:
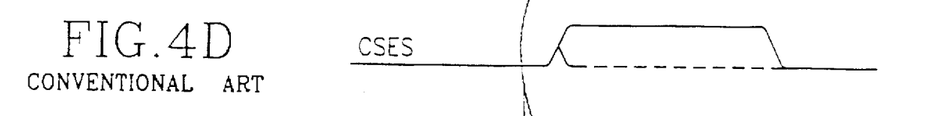
Figure 4E:
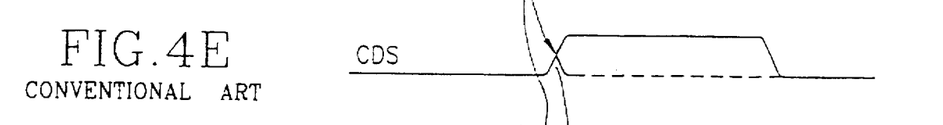
Figure 4F:
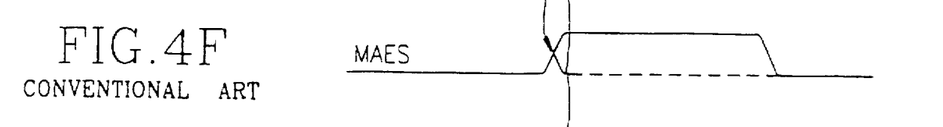
Figure 4G:
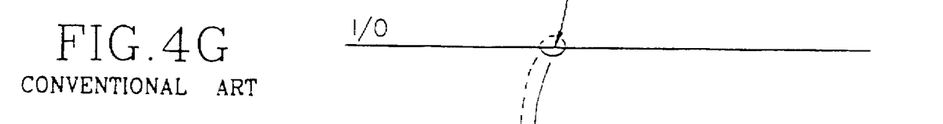
Figure 4H:
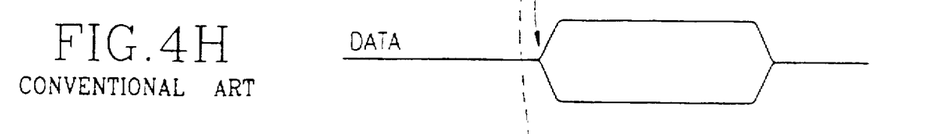
Figure 4I:
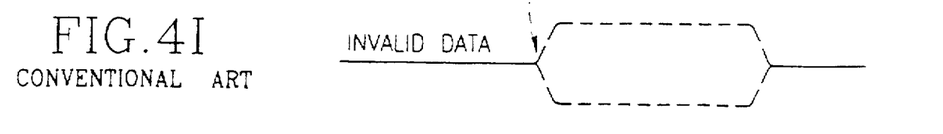

The conventional memory circuit is disadvantageous in that, when an abnormality such as noise or a glitch is received into the input buffer 1, the address signal transitions prematurely back high (as designated by the dotted line of FIG. 4A). The glitch is then buffered as would be a valid address signal, as depicted by the dotted line of FIG. 4B. Then, the address transition detecting unit 2 provides an incomplete address transition detecting signal (denoted by the dotted line of FIG. 4C). The column decoder 6 outputs an abbreviated column decoding signal (depicted as a dotted line in FIG. 4E) due to the unstable address transition detecting signal ADTS. The abbreviated CDS and MAES pulses produce an I/O signal (FIG. 4G) that is insufficient to fully transfer the contents of the memory cell 7 to the output buffer 11. In other words, the I/O signal is so abbreviated that it does not make possible the formation of a minimum voltage difference needed for the main amplifier 10 to carry out the sensing operation shown, as a solid line in FIG. 4D. Therefore, the column switch 8 is improperly operated as shown by the dotted line of FIG. 4D, and erroneous/ incomplete data as shown in FIG. 4I is output from the memory cell and through the main amplifier 10 and output buffer 11.

SUMMARY OF THE INVENTION

Accordingly, it is an object of the present invention to provide a column switch enable circuit, in a memory, for generating a column switch enable signal that assumes a substantially static high logical state during a normal mode of operation, and that assumes the logical high state in a pulsed format during a refresh mode of operation.

Accordingly, it is an object of the present invention to provide a circuit: for generating a column switch enable signal of a memory in response to an external column start signal which acts as an external control signal in a normal mode, in order to prevent erroneous data from being output after the input of an abnormal address signal; and for generating a column switch enable signal having a pulse width of a sum signal (of address transition detecting signals) in a mode other than the normal mode so as to decrease the current dissipated during the input and output of the data.

To achieve the above objects of the present invention, there is provided a circuit for generating a column switch enable signal of a memory, in which a first signal shape controlling unit supplies a first control signal to control a shape of the column switch enable signal in response to an externally-provided column start signal in a normal mode, and a second signal shape controlling unit supplies a second control signal to control the shape of the column switch enable signal in response to a sum signal of an externally-provided address transition detecting signal in a refresh mode. Then, a signal generating unit generates the column switch enable signal based upon the first control signal or the second control signal from the first signal shape controlling unit or second signal shape controlling unit, respectively.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Figure 5:
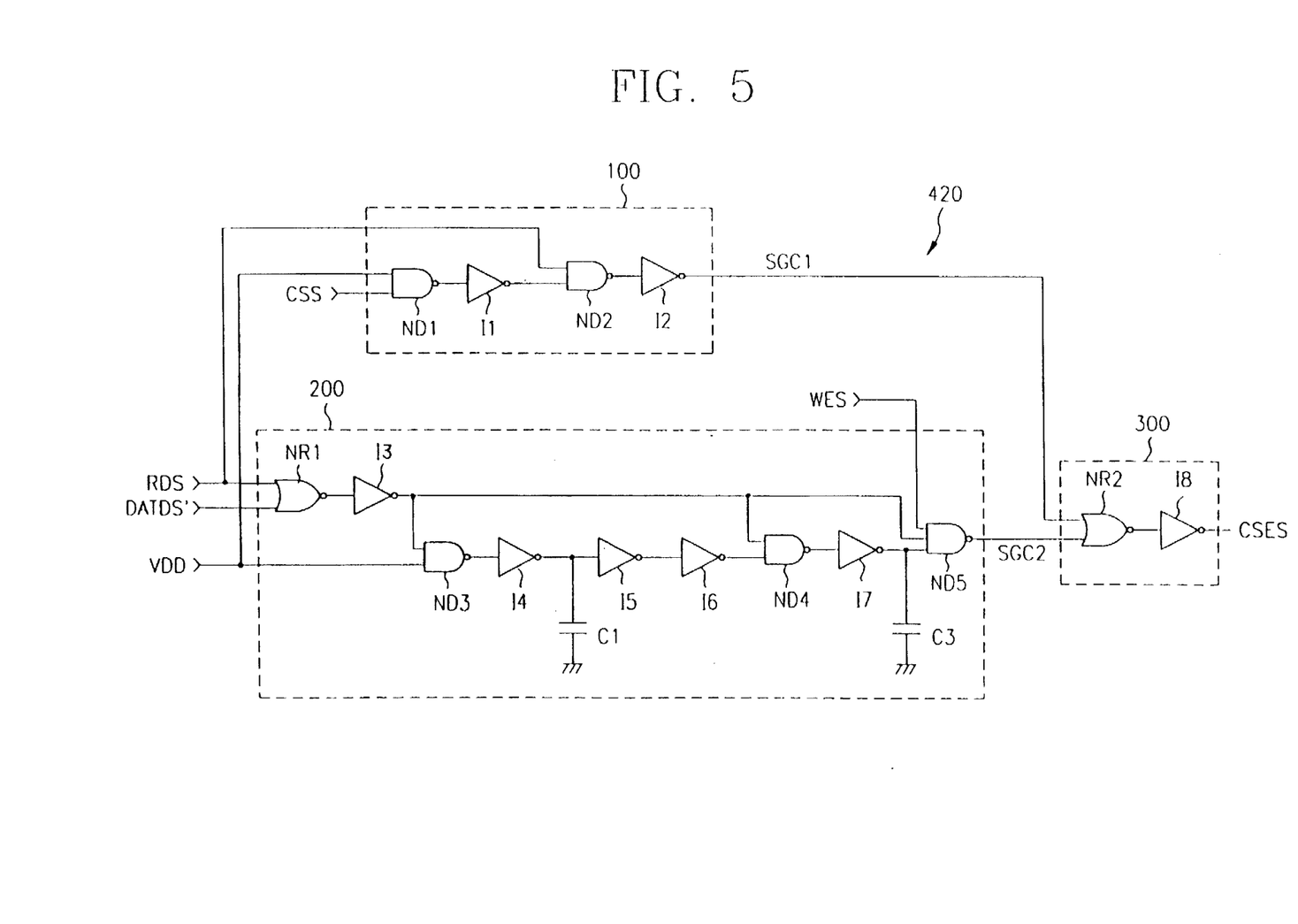
FIG. 5 is a circuit for generating a column switch enable signal of a memory according to one embodiment of the present invention.
Figure 8:
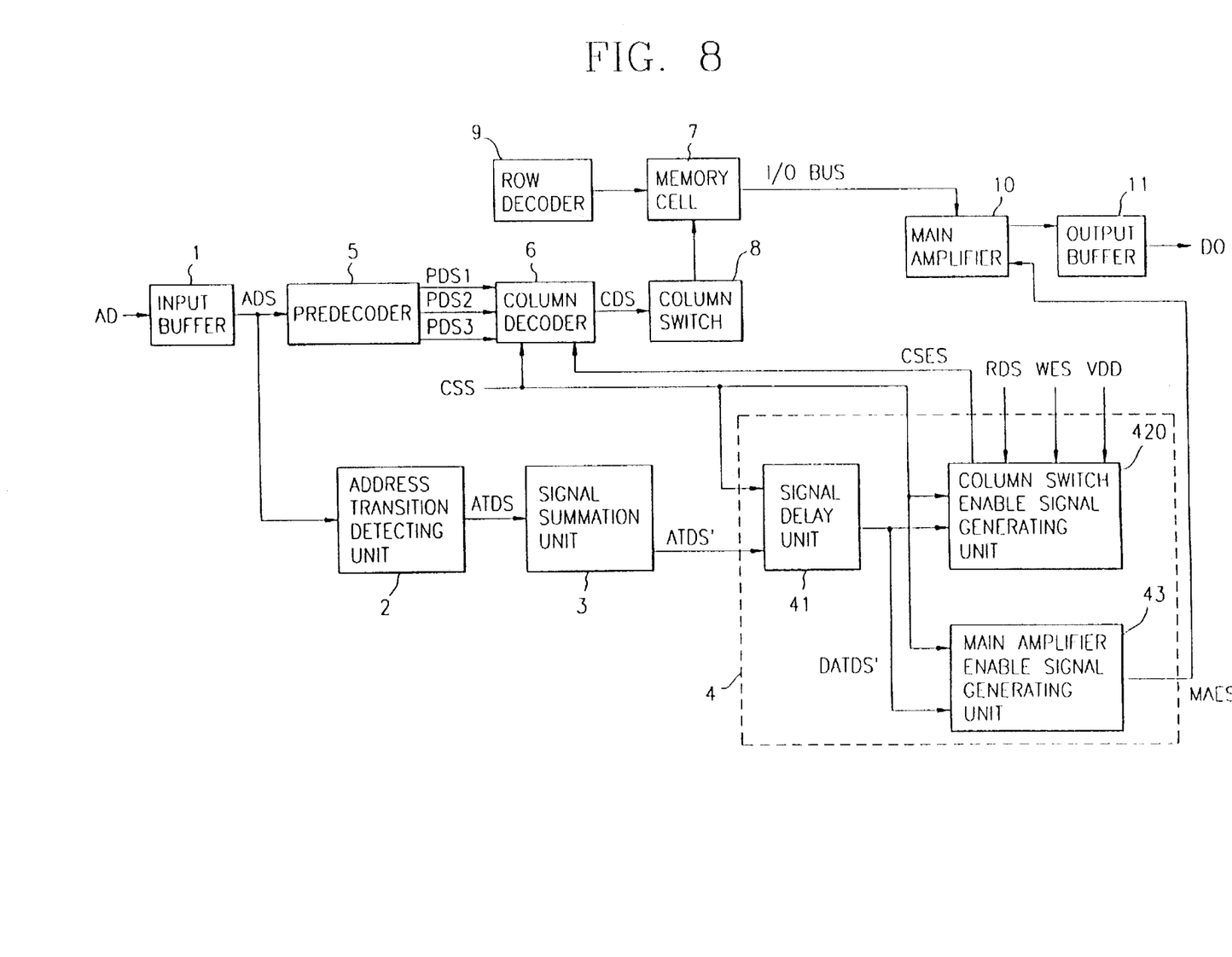
FIG. 8 is a block diagram showing the circuit of FIG. 5 incorporated into a memory circuit.

The circuit 420 of FIG. 5 generally replaces the column switch enable signal generator 42 of FIG. 1, as depicted in FIG. 8. The circuit of FIG. 5, a circuit for generating a column switch enable signal CSES of a memory according to one embodiment of the present invention, includes a first signal shape controlling unit 100 and a second signal shape controlling unit 200. The first signal shape controlling unit 100 supplies a first control signal SGC1 for controlling the shape of a column switch enable signal CSES based upon an externally-provided column start signal CSS in a normal mode.

The second signal shape controlling unit 200 of FIG. 5 supplies a second control signal SGC2 for controlling a shape of the column switch enable signal CSES based upon the externally-provided delayed address transition detecting summation signal DATDS' in a refresh mode. A signal generating unit 300 generates the column switch enable signal CSES based upon the first control signal SGC1 or the second control signal SGC2 from the first signal shape controlling unit 100 or second the signal shape controlling unit 200, respectively.

In the first signal shape controlling unit 100 of FIG. 5, a NAND gate ND1 executes the NAND operation on the externally-provided column start signal CSS and a power source voltage VDD. An inverter I1 inverts the output from NAND gate ND1. A NAND gate ND2 executes the NAND operation on the signal from the inverter I1 and an externally-provided refresh mode detecting signal RDS. An inverter I2 inverts the output from the NAND gate ND2 to produce a first control signal SGC1.

The second signal shape controlling unit 200 includes a NOR gate NR1 for NORing the externally-provided refresh mode detecting signal RDS and the delayed signal DATDS'. An inverter I3 inverts the output from the NOR gate NR1. A NAND gate ND3 performs the NAND operation on the output signal from the inverter I3 and the power source voltage VDD. An inverter I5 and I6 sequentially invert the output signal from the NAND gate ND3 after having been passed through an inverter I4 and a capacitor C1 (which is connected between the output of inverter I4 and ground). The output from inverter I6 is connected to ground through a capacitor C2.

A NAND gate ND4 performs the NAND operation on the signal from inverter I3 and the output signal from the inverter I6. An inverter I7 inverts the output from the NAND gate ND4. The output from inverter I7 is connected to ground through a capacitor C3. A NAND gate ND5 performs a NAND operation on an externally-provided write enable signal WES, the output signal from the inverter I3, and the output signal from the inverter I7. The output from the NAND gate ND5 is the second control signal SGC2.

The column start signal CSS, the write enable signal WES, the sum signal ATDS' and the refresh mode detecting signal RDS are well known to those of ordinary skill in the art, and are typically generated by a memory controller and/or a microprocessor which desires access to the memory cell 7. Further discussion of how these are generated is unnecessary.

The signal generating unit 300 has a NOR gate NR2 for NORing the first control signal SGC1 from the inverter I2 of the first signal shape controlling unit 200, and the second control signal SGC2 from the NAND gate ND5 of the second signal shape controlling unit 200. An inverter I8 is provided for inverting the signal from the NOR gate NR2 thereby producing the column switch enable signal CSES.

The operation of the circuit according to above described embodiment of the present invention will be described in detail with reference to FIGS. 1, 5, 6 and 7.

Figure 6A:
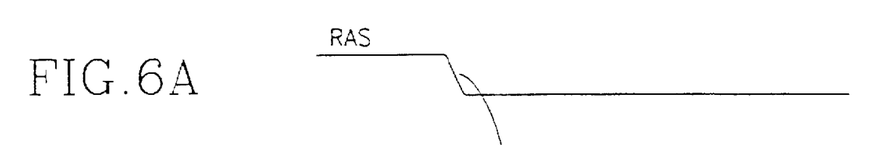
FIGS. 6A through 6G show I/O waveforms of respective units shown in FIG. 5 in a normal mode.
Figure 6B:
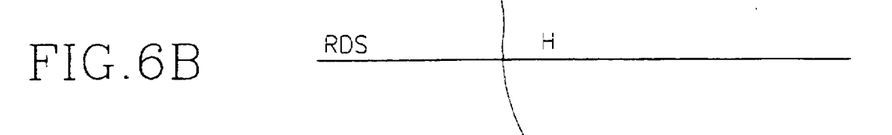
Figure 6C:
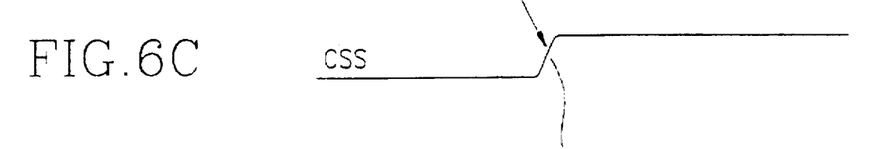

The operation of the circuit in a normal mode will be described first. In the normal mode, a refresh mode detecting signal RDS is maintained in a high logic state as shown in FIG. 6B. A column start signal CSS goes from a low logic state to a high state (as shown in FIG. 6C) when a row strobe address signal /RAS (as shown in FIG. 6A) goes from the high state to the low state.

The NAND gate ND1 in the first signal shape controlling unit 100 is supplied with the power source voltage VDD on one input terminal and the column start signal CSS (transitioning to the high logic state) on the other input terminal. The NAND gate ND1 NANDs the signals to provide a low level signal which is inverted via the inverter I1 into a high level signal.

Figure 6D:
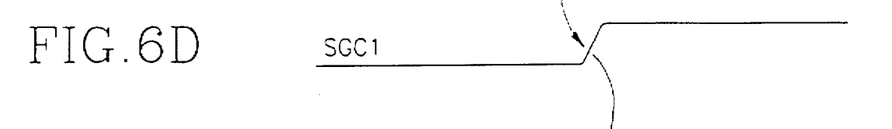

Successively, NAND gate ND2 performs a NAND operation on the external refresh mode detecting signal RDS (which maintains a high logic state) and the high level signal from the inverter I1 so as to provide a low level signal which is inverted by the inverter I2 into the high level first control signal SGC1. The signal SGC1 is shown in FIG. 6D.

The NOR gate NR2 in the signal generating unit 300 receives the first control signal SGC1 in its high state from the inverter I2 and thus produces a low level signal regardless of the logic state of the second control signal SGC2 from the second signal shape controlling unit 200. The output low signal from the NOR gate NR2 passes through inverter I8 to be supplied as the column switch enable signal CSES in a high logic state.

Figure 6E:
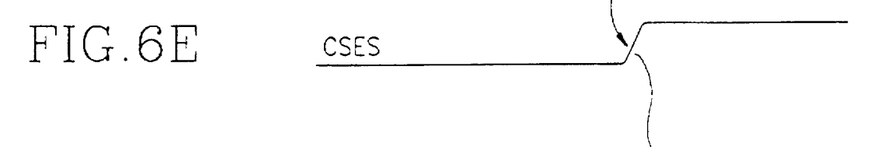

Consequently, the column switch enable signal CSES is generated based upon the externally-provided column start signal CSS. The signal CSES is shown in FIG. 6E.

Figure 6F:
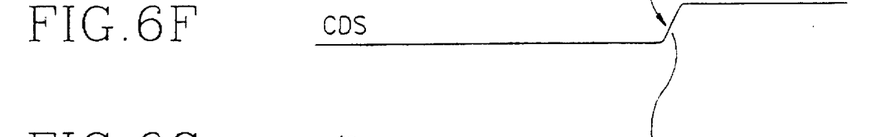

Successively, a column decoder such as that shown at reference numeral 6 of FIG. 1 decodes the predecoding signals PDS1~PDS3 from the pre-decoding unit in response to the high-level column switch enable signal CSES from the signal generating unit 300 as described above to produce a high-level column decoding signal CDS as shown in FIG. 6F. In response to the output column decoding signal CDS being in a high logic state, the column switch 8 is turned on.

Figure 6G:
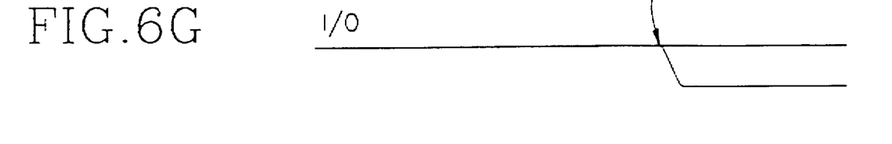

Therefore, the data previously stored in the memory cell 7 is supplied via the I/O bus due to the low-level I/O signal from the column switch 8 shown in FIG. 6G. The data is provided externally out of the memory after sequentially passing through the main amplifier 10 and the output buffer 11.

The operation of the column switch enable circuit in a mode other than the normal mode, e.g., a refresh mode, will now be described. If the column switch enable signal CSES were made static at the high level during the refresh operation, then the data retention current would increase such that this technique could not be used with a low power device. The column switch enable signal CSES according to the present invention is generated in the form of pulses during a refresh operation, which improves current consumption characteristics sufficiently to permit use in low power devices.

Figure 7A:
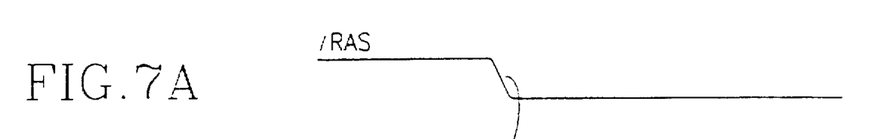
FIGS. 7A through 7H show I/O waveforms of respective units shown in FIG. 5 in a refresh mode.
Figure 7B:
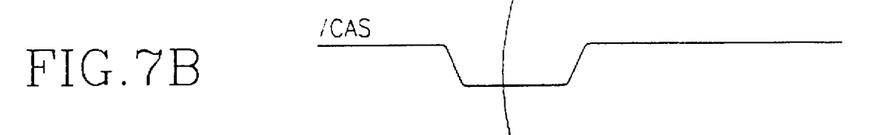
Figure 7C:
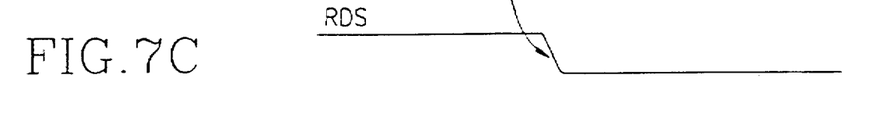

First, the refresh mode detecting signal RDS goes from a high logic state to a low logic state as shown in FIG. 7C when the row address strobe signal /RAS shown in FIG. 7A goes from the high logic state to the low logic state. Again, generation of the signals RDS and /RAS is well known to those of ordinary skill i the art; further discussion of how they are generated is unnecessary.

Figure 7D:
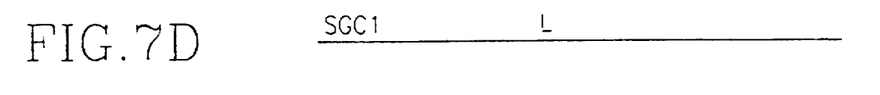

Accordingly, the NAND gate ND2 in the first signal shape controlling unit 100 of FIG. 5 receives the refresh mode detecting signal RDS as it transitions to the low logic state, and supplies a high level signal regardless of the logic status of the signal supplied to the other input terminal of the NAND gate ND2. The output high level signal from the NAND gate ND2 passes through the inverter I2 to be provided as the first control signal SGC1 in the low logic state (as shown in FIG. 7D).

Also, NOR gate NR1 in the second signal shape controlling unit 200 is provided with the external refresh mode detecting signal RDS (transitioning to the low state) on one input terminal, and a low level delayed ATD sum signal DATDS' from the signal delay unit 41 of FIG. 8 on the other input terminal. The NOR operation results in a high level signal which is inverted into a low level signal by inverter I3.

Successively, the NAND gate ND3 receives the low level signal from the inverter I3 on one input terminal and the power source voltage VDD on the other input terminal. The resulting NAND operation produces a high level signal which is inverted, after sequentially passing through the inverter I4 and the capacitor C1, into a low level signal.

The inverters I5 and I6 sequentially invert the inverted low signal having passed through the inverter I4 and capacitor C1, and thus provide a low level signal.

The NAND gate ND4 receives the low level signal from the inverter I3 on one input terminal and the low level signal from the inverter I6 on the other input terminal. The NAND operation supplies a high level signal which sequentially passes through inverter I7 and the capacitor C3, and is thus provided as a low level signal.

The NAND gate ND5 receives the externally-supplied write enable signal WES, the low level signal from the inverter I3, and the low level signal sequentially passing through the inverter I7 and the capacitor C3, on respective input terminals. The NAND gate ND5 provides a high level signal as second control signal SGC2.

Figure 7E:
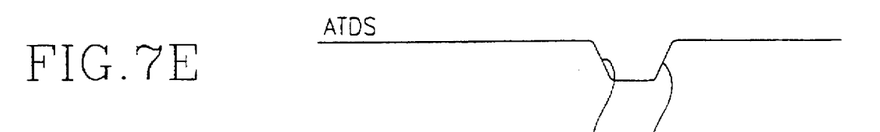
Figure 7F:
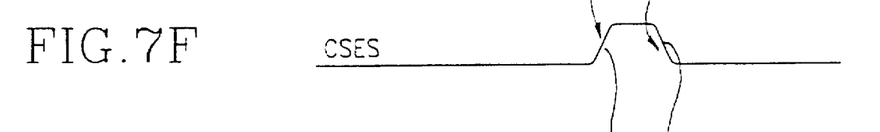

Thus, the NOR gate NR2 in the signal generating unit 300 receives the first control signal SGC1 in a low logic state from the inverter I2 and a second control signal SGC2 in a high logic state from the NAND gate ND5, thereby providing a low level signal due to the second control signal SGC2. The output low level signal passes through the inverter I8 to be supplied as the column switch enable signal CSES in a high logic state as shown in FIG. 7F.

As a result, the column switch enable signal CSES has a pulse width at the high logic state substantially equal to the duration, at the low logic state, of the ATD sum signal ATDS' from the signal summing unit 3. The pulse width of the sum signal ATDS' is shown generally in FIG. 7E.

Figure 7G:
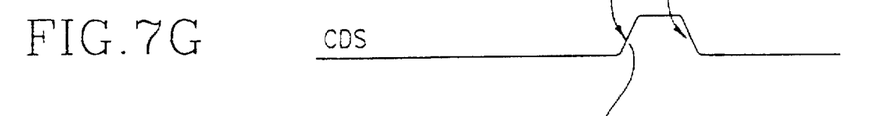
Figure 7H:
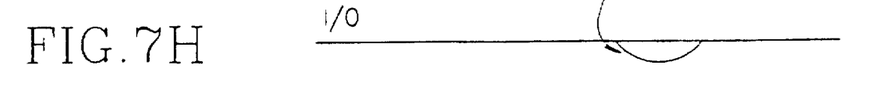

Then, as described above, the column decoder 6 of FIG. 1 decodes pre-decoding signals PDS1~PDS3 from the pre-decoding unit 5 in response to the high-level column switch enable signal CSES from the signal generating unit 300, and provides the column decoding signal CDS in a high logic state as shown in FIG. 7G. Thus, the column switch 8 is turned on by the output of a high-level column decoding signal CDS, so that the data previously stored in the memory cell 7 is output after sequentially passing through the I/O bus, the main amplifier 10, and the output buffer 11. The column switch 8 produces the low-level I/O signal shown in FIG. 7H in order to activate the memory cell 7.

The circuit for generating the column switch enable signal of the memory according to the present invention as described above produces the column switch enable signal CSES in response to the externally-supplied column start signal in the normal mode to prevent erroneous data from being output when an abnormal address signal is supplied into the memory.

Furthermore, in the case of a mode other than the normal mode, e.g., a refresh mode, the column switch enable signal CSES having a pulse width substantially equal to that of the ATD sum signal is generated in response to the ATD sum signal, which decreases the amount of current dissipated during the input and output of data, thereby reducing power consumption.

While the present invention has been particularly shown and described with reference to a particular embodiment thereof, it will be understood by those skilled in the art that various changes in form and details may be effected without departing from the spirit and scope of the invention, and its equivalents, as defined by the appended claims.

What is claimed is:

1. A circuit for generating a column switch enable signal of a memory, the memory being accessed in at least normal and refresh modes by a column switch enable signal, said circuit comprising:

first signal shape controlling means for receiving, in the normal mode an externally-provided column start signal and for producing a first control signal based upon the column start signal;

second signal shape controlling means for receiving, in the refresh mode a sum signal indicating that a predetermined number of memory accesses have occurred and for producing a second control signal based upon the sum signal; and signal generating means, operatively connected to said first and second signal shape controlling means, for generating a column switch enable signal based upon the first control signal and the second control signal respectively received from said first signal shape controlling means and second signal shape controlling means, the column switch enable signal enabling access to the memory.

2. The circuit for generating a column switch enable signal of a memory as claimed in claim 1, wherein said first signal shape controlling means includes:

a first NAND gate for NANDing said column start signal and a power source voltage, and for providing an output signal;

a first inverter for inverting the output signal from said first NAND gate and for providing an inverted signal;

a second NAND gate for NANDing the inverted signal from said first inverter and an externally-provided refresh mode detecting signal; and a second inverter for inverting an output signal from said second NAND gate, thereby producing the first control signal.

3. The circuit for generating a column switch enable signal of a memory as claimed in claim 1, wherein said second signal shape controlling means comprises:

a NOR gate for NORing an externally-provided refresh mode detecting signal and the sum signal of said address transition detecting signals, and for providing an output signal;

a first inverter for inverting the output signal from said NOR gate and producing an inverted signal;

a first NAND gate for NANDing the inverted signal from said first inverter and a power source voltage;

a second inverter for inverting an output from said first NAND gate;

third and fourth inverters for sequentially inverting, a signal from said second inverter;

a second NAND gate for NANDing the inverted signal from said first inverter and a signal from said fourth inverter;

a fifth inverter for inverting a signal from said second NAND gate; and a third NAND gate for NANDing an externally-provided write enable signal and the inverted signal from said first inverter and a signal from said fifth inverter thereby supplying the second control signal.

4. The circuit for generating a column switch enable signal of a memory as claimed in claim 3, further comprising:

a first capacitor connected to an output of said second inverter.

5. The circuit for generating a column switch enable signal of a memory as claimed in claim 4, further comprising: a second capacitor connected to an output of said fourth inverter.

6. The circuit for generating a column switch enable signal of a memory as claimed in claim 5, further comprising:

a third capacitor connected to an output of said fifth inverter.

7. The circuit for generating a column switch enable signal of a memory as claimed in claim 1, wherein said signal generating unit comprises:

a NOR gate for NORing the first control signal from said from said first signal shape controlling means and the second control signal from said second signal shape controlling means; and an inverter for inverting an output signal from said NOR gate, thereby supplying the column switch enable signal.

8. A method for generating a switch enable signal of a memory, the memory being accessible in response to the switch enable signal, said method comprising the steps of:

(a) receiving an external column start signal, the column start signal indicating that a predetermined unit in memory is to be accessed;

(b) processing the received column start signal and producing a first control signal, the first control signal indicating that memory should be accessed;

(c) receiving a sum signal indicating that a predetermined number of memory accesses have been performed;

(d) processing the received sum signal and producing a second control signal, the second control signal indicating that memory should be accessed; and (e) producing a switch enable signal based on the first and second control signals, the switch enable signal permitting the predetermined unit of memory to be accessed.

9. The method for generating a switch enable signal as claimed in claim 8, wherein said step (b) includes the sub-steps of:

(b-1) receiving a refresh mode detecting signal, the refresh mode detecting signal indicating that memory is to be accessed for refreshing;

(b-2) processing the received column start signal together with the received refresh mode detecting signal; and (b-3) producing the first control signal based on the processing of said sub-step (b-2).

10. The method for generating a switch enable signal as claimed in claim 9, wherein said sub-step (b-2) includes the sub-steps of:

NANDing the column start signal and a high logic level signal, and inverting a result of the NANDing, and NANDing the inverted result of the NANDing with the refresh mode detecting signal, and providing a NAND result; and wherein said sub-step (b-3) includes inverting the NAND result to thereby produce the first control signal.

11. The method for generating a switch enable signal as claimed in claim 8, wherein said step (d) includes the sub-steps of:

(d-1) receiving a refresh mode detecting signal, the refresh mode detecting signal indicating that memory is to be accessed for refreshing;

(d-2) processing the received sum signal together with the received refresh mode detecting signal; and (d-3) producing the second control signal based on the processing of said sub-step (d-2).

12. The method for generating a switch enable signal as claimed in claim 11, wherein said sub-step (d-2) includes the sub-steps of:

NORing the sum signal and the refresh mode detecting signal, and inverting a result of the NORing, NANDing the inverted result of the NORing with a high logic level signal and producing a first NAND result, inverting the first NAND result and producing an inverted NAND result, NANDing the inverted NAND result and the inverted result of the NORing and producing a second NAND result, inverting the second NAND result to provide a second inverted NAND result, receiving a write enable signal, and NANDing the second inverted NAND result and the first NAND result and the write enable signal to produce a third NAND result, the third NAND result being the second control signal.

13. The method for generating a switch enable signal as claimed in claim 8, wherein said step (e) includes the sub-step of:

(e-1) NORing the first and second control signals.

14. The method for generating a switch enable signal as claimed in claim 13, wherein said sub-step (e-1) produces a first NOR signal, and wherein said step (e) further includes the sub-step of:

(e-2) inverting, after the NORing of said sub-step (e-1), the first NOR signal to thereby produce the switch enable signal.

* * * * *